(12) United States Patent
Cho

(10) Patent No.: US 7,115,490 B2
(45) Date of Patent: Oct. 3, 2006

(54) APPARATUS AND METHOD FOR INTERLOCKING A POWER SUPPLY TO ION IMPLANTATION EQUIPMENT, METHOD AND APPARATUS FOR GENERATING AN INTERLOCKING SIGNAL, METHOD AND APPARATUS FOR INTERRUPTING AN ION IMPLANTATION PROCESS, AND AN INTERLOCKING SYSTEM

(75) Inventor: Yeon-Ha Cho, Gyeonggi-do (KR)

(73) Assignee: Samsung Electronics Co., Ltd., Gyeoniggi-do (KR)

( * ) Notice: Subject to any disclaimer, the term of this patent is extended or adjusted under 35 U.S.C. 154(b) by 381 days.

(21) Appl. No.: 10/423,943

(22) Filed: Apr. 28, 2003

(65) Prior Publication Data

US 2004/0002173 A1    Jan. 1, 2004

(30) Foreign Application Priority Data

Jun. 26, 2002    (KR) ...................... 10-2002-0036101

(51) Int. Cl.
    *H01L 21/04*    (2006.01)
(52) U.S. Cl. ...................................................... 438/510
(58) Field of Classification Search .................. 438/10, 438/510; 318/139; 250/492.3, 492.21, 311, 250/288; 216/24
    See application file for complete search history.

(56) References Cited

U.S. PATENT DOCUMENTS 4,008,423 A * 2/1977 Christianson et al. ........ 318/139
6,300,642 B1 * 10/2001 Cho et al. .............. 250/492.21

\* cited by examiner

*Primary Examiner*—Carl Whitehead, Jr.
*Assistant Examiner*—Monica D. Harrison
(74) *Attorney, Agent, or Firm*—Harness, Dickey & Pierce, PLC

(57) ABSTRACT

An apparatus and a method for interlocking power to ion implantation equipment. The apparatus may include a positive and a negative power supply which generates a positive voltage and a negative voltage respectively, a comparator which compares the positive voltage and the negative voltage, and a signal generating unit which generates an interlocking signal which interlocks the positive and negative power supplies when a sum of a first relative value of the positive voltage and a second relative value of the negative voltage does not equal zero. The apparatus may further include a switching unit which changes a mode of the positive and negative power supplies from a remote mode to a local mode when the sum of the relative values does not equal zero. The switching unit may be a relay switch. Power output lines may connect the positive and negative power sources to a lens assembly unit.

21 Claims, 3 Drawing Sheets

APPARATUS AND METHOD FOR INTERLOCKING A POWER SUPPLY TO ION IMPLANTATION EQUIPMENT, METHOD AND APPARATUS FOR GENERATING AN INTERLOCKING SIGNAL, METHOD AND APPARATUS FOR INTERRUPTING AN ION IMPLANTATION PROCESS, AND AN INTERLOCKING SYSTEM

CROSS-REFERENCE TO RELATED APPLICATIONS

This U.S. non-provisional patent application claims priority under 35 U.S.C. § 119 to Korean Patent Application 2002-36101, filed Jun. 26, 2002, the contents of which are hereby incorporated by reference in their entirety.

BACKGROUND OF THE INVENTION

1. Field of the Invention

The present invention relates generally to ion implantation, and more specifically to an apparatus and a method for interlocking a power supply to ion implantation equipment when a voltage difference between a positive and a negative voltage is detected, an apparatus and a method for generating an interlocking signal, an apparatus and a method for interrupting an ion implantation process, and an interlocking system.

2. Description of the Related Art

Ion implantation is a semiconductor process for converting p-type dopant atoms (e.g., boron (B), aluminum (Al), and indium (In)), each of which has three valence electrons, or n-type dopant atoms (e.g., antimony (Sb), phosphorus (P), and arsenic (As)), each of which has five valence electrons, to a plasma ion beam and injecting impurity ions converted from the dopant atoms into a lattice of silicon to form conductors and resistors in a silicon wafer. Ion implantation may be advantageous in that it is relatively simple to control an implantation depth where the dopant atoms are placed in the silicon crystal lattice and to control the concentration of the impurity ions.

Conventional ion implantation equipment may include three systems (e.g., three auxiliary systems). For example, the ion implantation equipment may include an ion source for extracting an ion beam, a beam line for analyzing and adjusting the focus and the energy level of the ion beam, and a target chamber that has a substrate, such as a semiconductor wafer, that is to have ions implanted therein. The target chamber may include an ion dose measuring and controlling system that measures and controls a dose of atoms implanted into a target wafer. In addition, a lens assembly may also be provided to focus the ion beam.

The lens assembly may include a plurality of individual lens assembly units, each of which may have four lenses symmetrically arranged. For example, in each individual lens assembly unit, two of the four lenses may be arranged in a first orientation, e.g., a vertical orientation, and the remaining two lenses may be arranged in a second opposing orientation, e.g., horizontal orientation. The lenses in the individual lens assembly units may be powered by a positive or by a negative power supply. The positive and negative power supplies generate a positive and negative voltage respectively which may be supplied to each of the respective lenses. Lenses symmetrically arranged in the same orientation may be connected to the same polarity power. The power may be supplied to the lenses upon receiving a control signal from a power supply interface unit.

When an error occurs in a connection line that interconnects a power supply interface unit to the positive and negative power supplies, or there is a malfunction in the positive and/or negative power supplies such that voltages are not supplied to the lenses, a focusing error may occur in the beam line. As a result, a size of the ion beam may become enlarged and the ion beam may not pass through a slot provided in a rotating disc in which a target wafer is placed. In addition, the ion beam may not be completely captured in a Faraday cup. Therefore, the enlargement of the ion beam due to the focusing error may result in improperly measuring the dose of atoms implanted into the target wafer.

SUMMARY OF THE INVENTION

In at least one exemplary embodiment of the present invention, an apparatus for interlocking a power supply to ion implantation equipment is provided. The apparatus may include a positive and a negative power supply which may generate a positive voltage and a negative voltage respectively, a comparator which may determine if the positive and negative power sources (and ion implantation equipment) are operating in a normal or abnormal manner, and a signal generating unit which may generate an interlocking signal which may interrupt an ion implantation process, e.g., the interlocking signal may interlock the positive and negative power supplies. The signal generating unit may generate the interlocking signal when a sum of a first relative value of the positive power supply and a second relative value of the negative power supply does not equal zero. In addition, the positive and negative power supplies may supply power to a lens assembly which may focus ion beams as they pass through the lens assembly. The lens assembly may include a plurality of individual lens assembly units. Voltage output lines may interconnect the lens assembly to the positive and negative power sources. The apparatus may further include a switching unit which changes a mode of the positive and negative power supplies from a remote mode to a local mode. The switching unit may be a relay switch. A power supply interface unit may be included to relay a control signal from a controller to the positive and negative power supplies. The apparatus may reduce the occurrence of focusing errors by comparing the voltages from the positive and negative power supplies before the positive and negative voltages are applied to the lens assembly.

In at least one exemplary embodiment of the present invention, there is provided a method for interlocking a power supply to ion implantation equipment. A control signal may be relayed to a positive and a negative power supply, e.g., via a power interface unit. The control signal may be generated by a controller. Positive and negative voltages generated by the positive and negative power supplies, respectively, may then be detected. The positive and negative power supplies may be connected to a lens assembly. The magnitude of the power supplied to the lens assembly may be determined by an output signal from the power interface unit.

A first relative value of the positive voltage and a second relative value of the negative voltage may be compared. If a sum of the first relative value of the positive voltage and a second relative value of the negative voltage equals zero, the positive and negative power supplies may operate in a remote mode. However, if the sum of the first and second relative values does not equal zero, the power supplies may be switched from the remote mode to a local mode in which the power supplies may be manually operated. In addition, when the sum of the first and second relative values does not equal zero, an interlocking signal may be generated which may interrupt an ion implantation process, e.g., by interlocking the positive and negative power supplies and stopping the ion implantation equipment. Changing the mode of the positive and negative power supplies and generating the interlocking signal may occur at substantially the same time, or the interlocking signal may be generated before or after the mode of the positive and negative power supplies is switched.

In at least one other exemplary embodiment of the present invention, an interlocking system is provided which may include a comparator, a switching unit, and a signal generating unit. The comparator may compare relative voltage values of a positive voltage and a negative voltage. The positive voltage and the negative voltage may be generated by a positive power supply and a negative power supply, respectively. The switching unit may change a mode of the positive and negative power supplies if there is a difference detected in the relative values of the positive and negative voltages. Optionally, the switching unit may be a relay switch. The signal generating unit may generate an interlocking signal when a sum of a first relative value of the positive power supply and the second relative value of the negative power supply does not equal zero.

BRIEF DESCRIPTION OF THE DRAWINGS

Exemplary embodiments of the present invention will be readily understood with reference to the following detailed description thereof provided in conjunction with the attached drawings in which.

DETAILED DESCRIPTION OF EXEMPLARY EMBODIMENTS OF THE INVENTION

Figure 1:
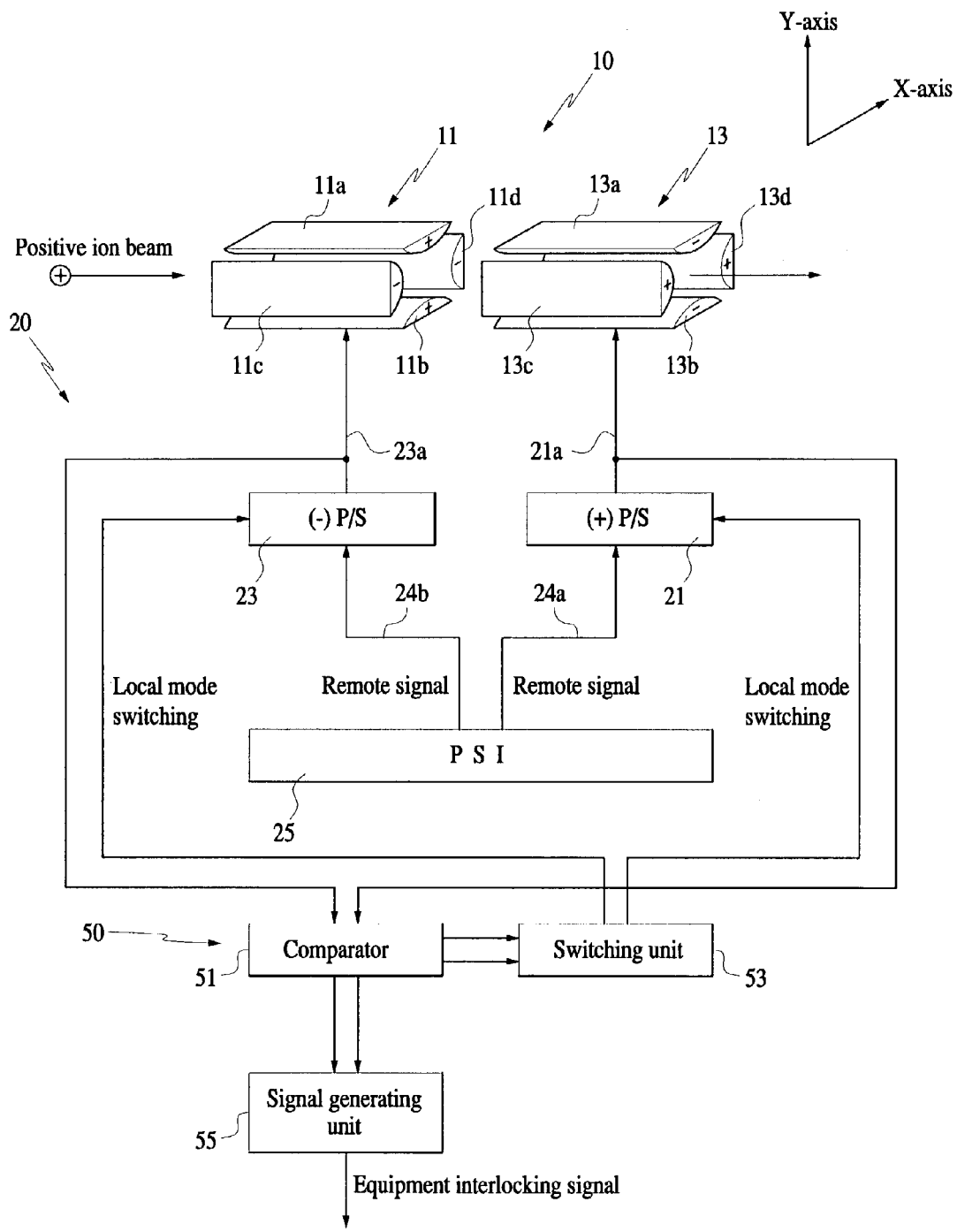
FIG. 1 is a schematic block diagram of a power supply interlocking apparatus in accordance with at least one exemplary embodiment of the present invention.

Exemplary embodiments of the present invention will now be described more fully with reference to the accompanying drawings, in which exemplary embodiments of the invention are shown. This invention may, however, be embodied in many different forms and should not be construed as being limited to the exemplary embodiments set forth herein. Rather, these exemplary embodiments are provided so that this disclosure will be thorough and complete and will fully convey the concept of the invention to those skilled in the art. In the drawings, the thicknesses of layers and regions are exaggerated for clarity. It is to be understood that when an element is referred to as being "substantially horizontal", the element may be horizontal or it may be nearly horizontal. In it to be further understood that when an element is referred to as being "substantially vertical", the element may be vertical or it may be nearly vertical. Throughout the specification, like numbers refer to like elements.

FIG. 1 is a schematic block diagram of a power supply interlocking apparatus 20 in accordance with at least one exemplary embodiment of the present invention.

As shown in FIG. 1, a lens assembly 10 may include at least one lens assembly unit. In a least one exemplary embodiment, the lens assembly 10 may include a plurality of individual lens assembly units 11 and 13 arranged in series. For example, lens assembly unit 11 may include four individual lenses 11a, 11b, 11c and 11d. Lenses 11a and 11b may be arranged in a first orientation, e.g., a substantially horizontal orientation, and lenses 11c and 11d may be arranged in a second, opposing orientation, e.g., in a substantially vertical orientation. In addition, lenses 11a and 11b may be symmetrically arranged and lenses 11c and 11d may be symmetrically arranged. Similar to lens assembly unit 11, lens assembly unit 13 may include four individual lenses 13a, 13b, 13c and 13d. Lenses 13a and 13b may be arranged (e.g., symmetrically arranged) in the first direction and lenses 13c and 13d may be arranged (e.g., symmetrically arranged) in the second direction. Lenses 11a, 11b, 11c, 11d, 13a, 13b, 13c, and 13d of the individual lens assembly units 11, 13 may be powered by a positive power supply 21 and a negative power supply 23.

Lenses arranged in substantially the same orientation in the lens assembly units 11, 13 may be powered by the same polarity power supply and lenses arranged in opposing orientations may be powered by a different polarity power supply. For example, lenses 11a and 11b, which may be arranged symmetrically in the same direction, may be powered by the positive power supply 21, and lenses 11c and 11d, which may be arranged symmetrically in the same orientation, may be powered by the negative power supply 23. On the other hand, lenses 13a, 13b, 13c, and 13d of lens assembly unit 13 may be powered with an opposite polarity to lenses 11a, 11b, 11c and 11d, respectively. For example, lenses 13a and 13b, which may be arranged symmetrically in the first orientation, may be powered by the negative power supply 23, and lenses 13c and 13d, which may be arranged symmetrically in the second orientation, may be powered by the positive power supply 21.

The lens assembly 10 may focus a positive or negative ion beam passing through the individual lens assembly units 11 and 13 by modifying the deflection of the ion beam, thereby adjusting a degree of dispersion of the ion beam and adjusting the ion density of the ion beam.

Voltage output lines 21a and 23a may interconnect lens assembly units 11 and 13 to positive and negative power supplies 21, 23. The positive and negative power supplies 21, 23, may also be connected to a power supply interface unit 25, such as by connection lines 24a, 24b. The power supply interface unit 25 may receive a control signal from a controller (not shown), which is relayed to the positive and negative power supplies 21, 23.

The voltage output lines 21a and 23a may be connected to an interlocking system 50. The interlocking system 50 may compare relative voltage values of the voltage output lines 21a and 23a with each other and may determine if there is an error in the positive and negative power supplies 21 and 23. If such an error is detected, the interlocking system 50 may generate an interlocking signal, which may interrupt an ion implantation process, e.g., the interlocking signal may interlock the positive and negative power supplies 21, 23. Thus, the power supply interlocking apparatus 20 may reduce abnormal voltages from being applied to the lens assembly 10 by checking the voltages to be supplied to the lens assembly 10.

The interlocking system 50 may include a comparator 51, a switching unit 53, and a signal generating unit 55. The switching unit may change a mode of the power supplies 21, 23, e.g., from a remote mode to local mode, in response to an output signal from the comparator 51. In the remote mode, or normal operation mode, the positive and negative power supplies 21, 23 output voltages which are dependent on the output signal of the power supply interface unit 25. On the other hand, in the local mode, the positive and negative power supplies 21, 23 may be operated manually so that an operator may inspect the power supply interlocking apparatus 20. For example, in the local mode, the voltage output lines 21a, 23a may maintain the generation of abnormal voltage values so that the operator may determine the error in the positive and negative power supplies 21, 23. The switching unit may be a relay switch, an electromagnetic relay (EMR) switch, or a contactless relay switch. Other suitable switches would be easily identified by one of skill in the art. In at least one exemplary embodiment, the switching unit is a relay switch.

The signal generating unit 55 may generate an interlocking signal which may interrupt an ion implantation process, e.g., by interlocking the positive and negative power supplies 21, 23. The signal generating unit 55 may generate the interlocking signal and the switching unit 53 may change the mode of the power supplies 21 and 23 at substantially the same time. Alternatively, the interlocking signal may be generated before or after the mode of the positive and negative power supplies 21, 23 is changed.

The comparator 51 may determine whether the positive and negative power supplies 21, 23 are operating in a normal manner or in an abnormal manner by adding relative voltage values of each of the voltage output lines 21a, 23a and comparing a result of the added voltage values to the value of zero "0". When the result of the addition of the relative voltage value of the voltage output line 21a and the relative voltage value of the negative output line 23a is zero ("0") the comparator 51 may determine that the power supplies 21, 23 (and the ion implantation equipment) are operating in a normal manner. For example, assuming that a relative voltage value of +90 V is detected in voltage output line 21a and a relative voltage value of −90 V is detected in voltage output line 23a, the result of the addition of the relative voltage values is zero (e.g., +90 V+−90 V=0). Thus, the comparator 51 may determine that there is no error in the positive and negative power supplies 21, 23. However, if the result of the addition of the relative voltage value of the positive power supply 21 and the relative voltage value of the negative power supply 23 does not equal zero, the comparator 51 may determine that there is a error in the power supplies and that the ion implantation equipment is operating in an abnormal manner.

Figure 2:
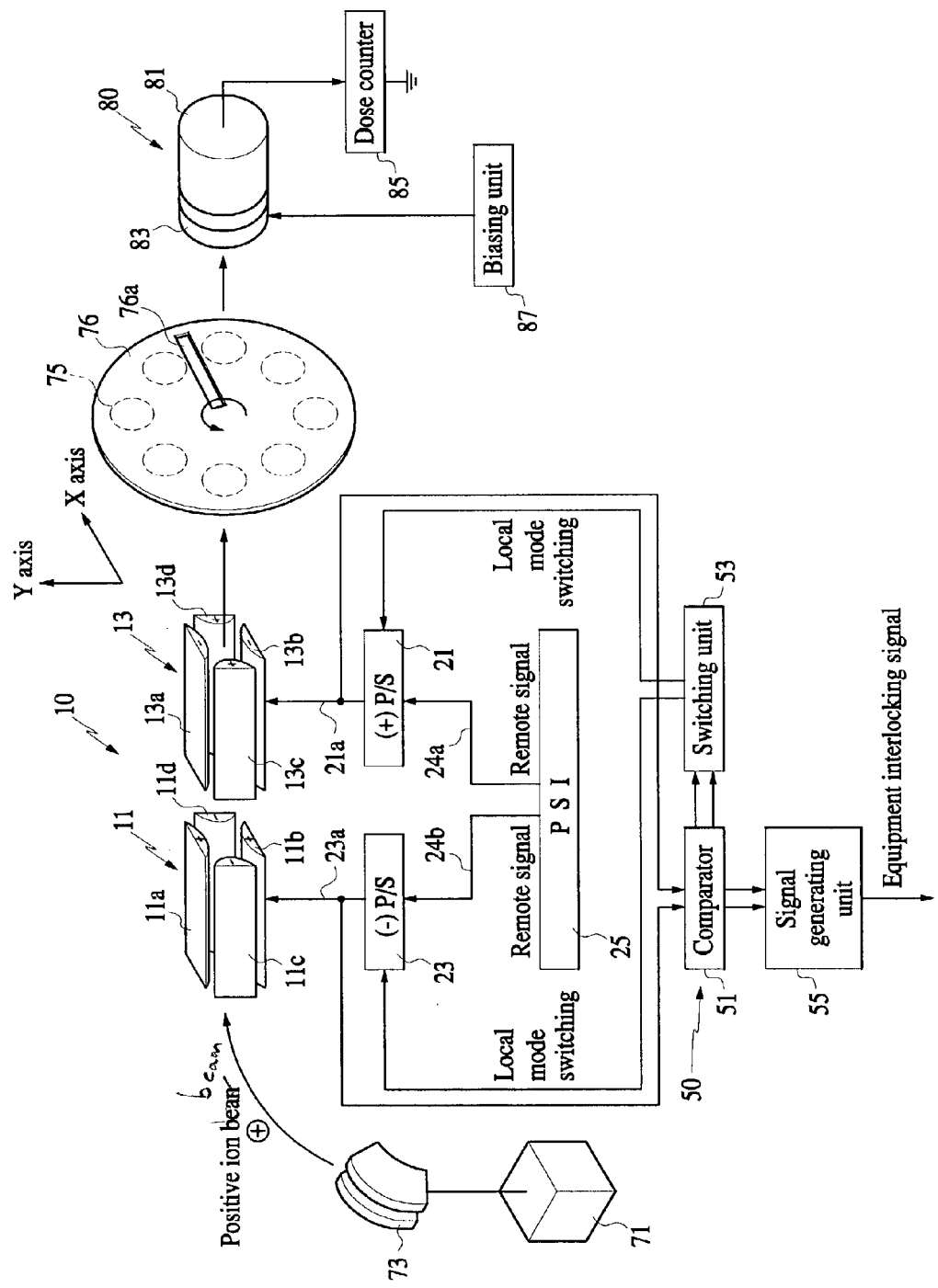
FIG. 2 is a schematic illustration of ion implantation apparatus including the power supply interlocking apparatus depicted in FIG. 1 in accordance with at least one exemplary embodiment of the present invention.

FIG. 2 is a schematic illustration depicting a configuration of an ion implantation equipment that includes the lens power supply interlocking apparatus depicted in FIG. 1 in accordance with at least one exemplary embodiment of the present invention. Referring to FIG. 2, the ion implantation equipment may include an ion source 71 for extracting an ion beam and an analyzing magnet 73 for selecting an ion species from the ion beam. The ion implantation equipment may further include a rotating disc 76 that may include a target substrate 75 (e.g., a semiconductor wafer) and a Faraday assembly 80 for detecting ion currents of the ion beam passing through a slot 76a located in the rotating disc 76.

The Faraday assembly 80 may include a Faraday cup 81 to capture ions and detect the ion currents of the captured ions, a bias ring 83 arranged on an input side of the Faraday cup 81, and a dose counter 85 connected to the Faraday cup 81 to measure the ion dose of ions injected into the target substrate 75.

The bias ring 83 may detect the charge current of ions output from the ion source 71 with reduced distortion. That is, without the bias ring 83, when the ions output from the ion source 71 strike the Faraday cup 81, secondary electrons may be generated. Such secondary electrons may then react with a photo resist film located on the target substrate 75 or may impact molecules in a process chamber, thereby producing new ions. Accordingly, it is difficult to accurately measure the charged ion current of the ions captured in the Faraday cup 81 and control the ion dose of ions injected into the target substrate 75 because newly generated ions may be added to the ions captured in the Faraday cup 81. However, when the bias ring 83 is present in the Faraday assembly 80, a bias voltage may be applied to the bias ring 83 by a biasing section 87 and the bias ring 83 may reduce ionization caused by the secondary electrons of new ions.

Figure 3:
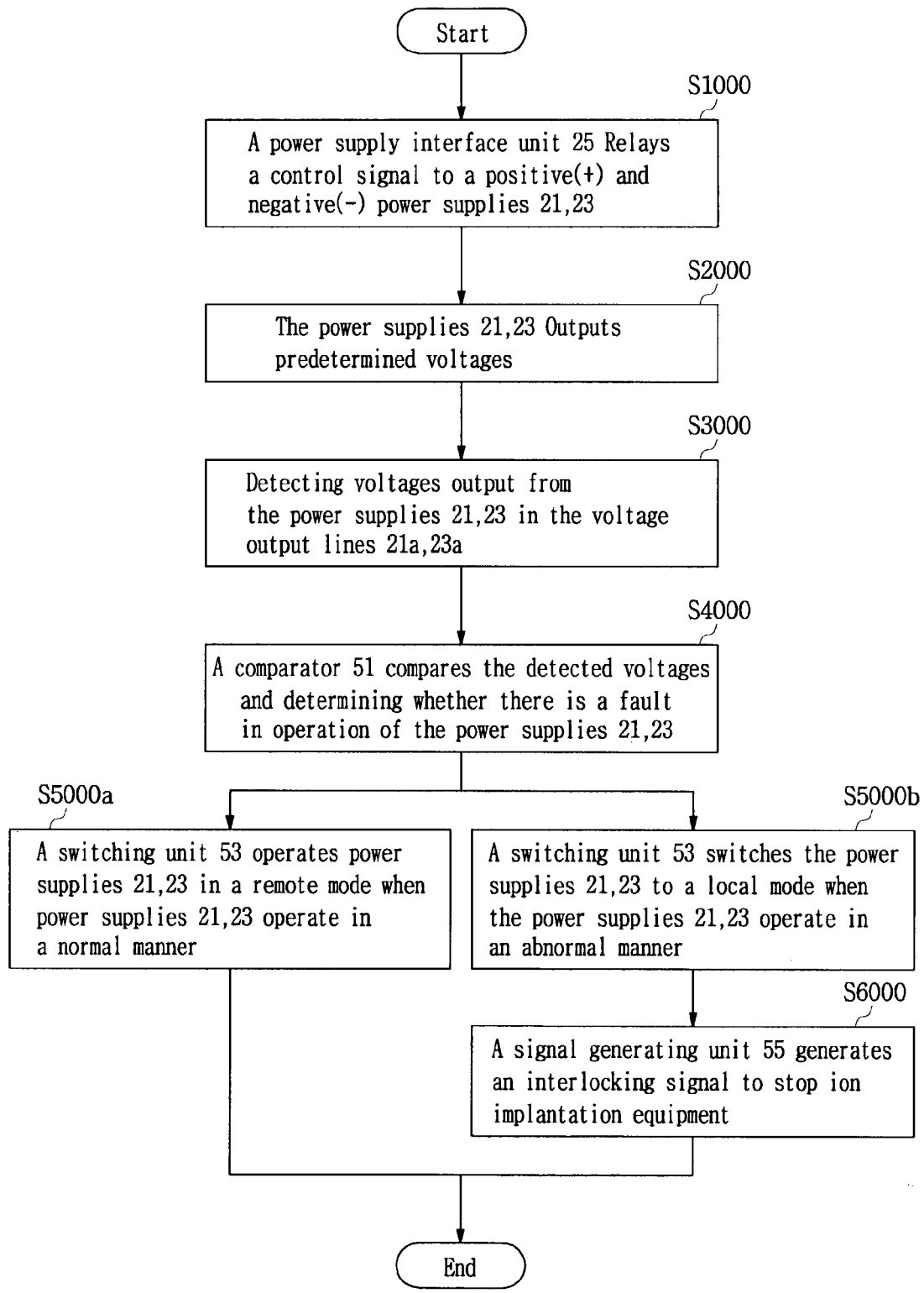
FIG. 3 is a flow chart depicting a sequence of steps for interlocking a power supply in the power supply interlocking apparatus depicted in FIG. 1 in accordance with at least one exemplary embodiment of the present invention.

FIG. 3 is a flow chart depicting a sequence for interlocking a power supply in ion implantation equipment in accordance with at least one exemplary embodiment of the present invention.

Referring to FIGS. 2 and 3, at step S1000, ions may be extracted from the ion source 71 and analyzed by the analyzing magnet 73. As a result, ion species which are to be injected into the target substrate 75 may be selected and the selected ion species may be directed into the lens assembly 10. At this time, the power supply interface unit 25 may relay a control signal to the positive and negative power supplies 21, 23.

At step S2000, upon receiving the control signal, the positive and negative power supplies 21 and 23 may apply voltages to the lens assembly 10 via the voltage output lines 21a and 23a in accordance with the control signal.

At step S3000, the voltages of the voltage output lines 21a and 23a may be detected, such as by a detecting unit (not shown), and the detected voltage values may be input into the comparator 51.

At step S4000, the comparator 51 may determine whether the positive and negative power supplies 21, 23, (and thus the ion implantation equipment), are operating in a normal manner or in an abnormal manner. As described above, the comparator 51 may determine whether the positive and negative power supplies are operating in a normal manner or in an abnormal manner by adding the relative voltage values of the voltage output lines 21a and 23a and comparing the sum of the relative voltage values with zero.

If the comparator 51 determines that the positive and negative power supplies 21, 23 are operating in a normal manner (e.g., the sum of the relative voltage values is zero and the ion implantation equipment is operating in a normal manner), in step 5000a, the switching unit 53 may maintain the mode of the positive and negative power supplies 21 and 23 in the remote mode. Thus, the positive and negative power supplies 21, 23 may continue to supply power to the lens assembly 10 in accordance with the control signal. A magnitude of power supplied to the lens assembly 10 may be determined by the output signal of the power supply interface unit 25.

On the other hand, if the comparator 51 determines that an error is occurring in the positive and negative power supplies 21, 23 (e.g., the sum of the relative values of the output lines 21a, 23a does not equal zero and the ion implantation equipment is operating in an abnormal manner), in step S5000b, the switching unit 53 may switch the mode of the positive and negative power supplies from the remote mode to the local mode. In step S6000, the signal generating unit 55 may generate the interlocking signal which may interlock the positive and negative power supplies 21, 23 and interrupt the ion implantation process, so that the ion implantation process may be stopped at step S6000. Step S5000b and step S6000 may occur at substantially the same time. As a result, the interlocking signal may not be delayed and the ion implantation process may be stopped after detection of the error.

When an abnormal voltage is applied to the lens assembly units 11, 13, a focusing error may occur. When a focusing error occurs, the size of the ion beam passing through the lens assembly 10 may be increased. As a result, the ion beam may not completely pass through slot 76a located in the rotating disc 76. Accordingly, a part of the ion beam may not be captured in the Faraday cup 81, and the ion dose injected into the target wafer 75 may be measured inaccurately. However, in accordance with exemplary embodiments of the present invention, since the positive and negative power supplies 21, 23 are monitored and the interlocking signal for stopping the ion implantation process is generated when an abnormal magnitude of voltage is detected, the occurrence of focusing errors may be reduced. Accordingly, it may be possible to determine the ion dose injected into the target substrate 75 with an increased accuracy.

While the invention has been particularly shown and described with reference to exemplary embodiments thereof, it should be understood by those skilled in the art that various changes in form and details may be made therein without departing from the spirit and scope of the invention as defined by the appended claims.

What is claimed is:

1. An apparatus for interlocking a power supply in ion implantation equipment comprising:
   a power supply interface unit which relays a control signal;
   a positive power supply which generates a positive voltage;
   a negative power supply which generates a negative voltage;
   a comparator which compares a first relative value of the positive voltage and a second relative value of the negative voltage;
   a switching unit which changes a mode of the positive and negative power supplies; and
   a signal generating unit which generates an interlocking signal to interlock the positive and the negative power supplies when a sum of the first relative value and the second relative value does not equal zero.

2. The apparatus according to claim 1, wherein the switching unit is a relay switch.

3. The apparatus according to claim 1, further comprising at least one lens assembly unit which focuses an ion beam passing there through in response to the positive and negative voltages.

4. The apparatus according to claim 3, further comprising voltage output lines to supply the positive and negative voltages to the at least one lens assembly unit.

5. The apparatus according to claim 3, wherein the positive and negative power supplies supply power to the at least one lens assembly unit.

6. The apparatus according to claim 1, further comprising a controller which relays a control signal to the power supply interface unit.

7. A method for interlocking power to ion implantation equipment comprising:
   relaying a control signal to a positive and a negative power supply;
   detecting a positive voltage and a negative voltage from the positive and negative power supplies respectively;
   comparing a first relative value of the positive voltage and a second relative value of the negative voltage;
   changing a mode of the positive and negative power supplies; and
   generating an interlocking signal which interlocks the positive and negative power supplies when a sum of a relative value of the positive voltage and a relative value of the negative voltage does not equal zero utilizing the apparatus of claim 1.

8. An interlocking system comprising:
   a comparator which compares a first relative value of a positive voltage from a positive power supply and a second relative value of a negative voltage from a negative power supply;
   a switching unit which changes a mode of the positive and negative power supplies; and
   a signal generating unit which generates an interlocking signal to interrupt an ion implantation process.

9. The interlocking system of claim 8, wherein the ion implantation process is interrupted by interlocking a power supply to a lens assembly unit in an ion implantation device.

10. The interlocking system of claim 8, wherein the signal generating unit generates the interlocking signal when a sum of the first relative value and the second relative value does not equal zero.

11. The interlocking system of claim 10, wherein the switching unit is a relay switch.

12. An apparatus for interrupting an ion implantation process comprising:
   a detecting unit which detects a positive voltage from a positive power supply and a negative voltage from a negative power supply;
   a comparator which compares a first relative value of the positive voltage and a second relative value of the negative voltage;
   a switching unit which changes a mode of the positive and negative power supplies; and
   a signal generating unit which generates an interlocking signal which interrupts the ion implantation process when a sum of the first relative value and the second relative value does not equal zero.

13. The apparatus of claim 12, wherein the switching unit is a relay switch.

14. The apparatus of claim 12, further comprising at least one lens assembly unit which focuses an ion beam passing there through in response to the positive and negative voltages.

15. The apparatus of claim 12, wherein the positive and negative power supplies supply power to the lens assembly unit.

16. A method for interrupting an ion implantation process comprising:
   detecting a positive voltage from a positive power supply and a negative voltage from a negative power supply;
   comparing a first relative value of the positive voltage and a second relative value of the negative voltage;
   changing a mode of the positive and negative power supplies; and
   generating an interlocking signal which interrupts the ion implantation process when a sum of the first relative value and the second relative value does not equal zero utilizing the apparatus of claim 12.

17. An apparatus for interlocking power to ion implantation equipment comprising:
   a positive power supply which generates a positive voltage;

a negative power supply which generates a negative voltage;

a comparator which compares a first relative value of the positive voltage and a second relative value of the negative voltage; and a signal generating unit which generates an interlocking signal to interlock the positive and the negative power supplies when a sum of the first relative value and the second relative value does not equal zero.

18. The apparatus of claim 17, further comprising a switching unit which changes a mode of the positive and the negative power supplies.

19. The apparatus of claim 18, wherein the switching unit is a relay switch.

20. The apparatus of claim 17, further comprising at least one lens assembly unit which focuses an ion beam passing there through in response to the positive and negative voltages.

21. The apparatus of claim 20, wherein the positive and negative power supplies supply power to the lens assembly unit.

* * * * *